(12) United States Patent
Choi et al.

(10) Patent No.: US 12,010,890 B2
(45) Date of Patent: Jun. 11, 2024

(54) DISPLAY DEVICE HAVING A COMPENSATION PATTERN

(71) Applicant: SAMSUNG DISPLAY CO., LTD., Yongin-si (KR)

(72) Inventors: Junho Choi, Asan-si (KR); Min-Chang Kim, Cheonan-si (KR); Eunkyung Yang, Seoul (KR)

(73) Assignee: SAMSUNG DISPLAY CO, LTD., Yongin-si (KR)

( * ) Notice: Subject to any disclaimer, the term of this patent is extended or adjusted under 35 U.S.C. 154(b) by 68 days.

(21) Appl. No.: 17/237,050

(22) Filed: Apr. 22, 2021

(65) Prior Publication Data
US 2022/0013622 A1 Jan. 13, 2022

(30) Foreign Application Priority Data
Jul. 10, 2020 (KR) ........................ 10-2020-0085384

(51) Int. Cl.
*H10K 59/131* (2023.01)
*H10K 50/842* (2023.01)
*H10K 59/12* (2023.01)
*H10K 71/00* (2023.01)

(52) U.S. Cl.
CPC ..... *H10K 59/1315* (2023.02); *H10K 50/8426* (2023.02); *H10K 71/00* (2023.02); *H10K 59/1201* (2023.02)

(58) Field of Classification Search
CPC . H01L 27/3279; H01L 51/5246; H01L 51/56; H01L 2227/323; H10K 59/1315; H10K 59/1201; H10K 71/00; H10K 50/8426
USPC .................................................. 257/40, 59
See application file for complete search history.

(56) References Cited

U.S. PATENT DOCUMENTS

| 8,633,044 B2 | 1/2014 | Hara et al. |
| 9,679,919 B2* | 6/2017 | Go ........................ H01L 27/124 |
| 10,825,885 B2 | 11/2020 | Moon et al. |
| 10,942,410 B2 | 3/2021 | Shin et al. |

(Continued)

FOREIGN PATENT DOCUMENTS

| KR | 10-0903486 | 6/2009 |
| KR | 10-1323087 | 10/2013 |

(Continued)

*Primary Examiner* — Eric W Jones
(74) *Attorney, Agent, or Firm* — KILE PARK REED & HOUTTEMAN PLLC

(57) ABSTRACT

A display device includes: an array substrate including a pixel array in a display area; an encapsulation substrate facing the array substrate; and a sealing member in a sealing area and between the array substrate and the encapsulation substrate. The array substrate includes: an organic insulation layer in a peripheral area between the display area and the sealing area; a power bus line in the peripheral area and including a first wiring layer and a second wiring layer that overlap the organic insulation layer; and a compensation pattern disposed under the sealing member, extending along an outer edge of the sealing member, and including a first compensation layer and a second compensation layer. The first compensation layer is connected to the first wiring layer, and the second compensation layer is on the first compensation layer and connected to the second wiring layer.

18 Claims, 11 Drawing Sheets

(56) References Cited

U.S. PATENT DOCUMENTS

| | | | |
|---|---|---|---|
| 2013/0049003 A1* | 2/2013 | Choi | H01L 51/56 |
| | | | 257/E27.119 |
| 2015/0001500 A1* | 1/2015 | Sung | H01L 51/52 |
| | | | 257/40 |
| 2015/0255527 A1* | 9/2015 | Oooka | H01L 27/3276 |
| | | | 438/18 |
| 2016/0086977 A1* | 3/2016 | Go | H01L 27/124 |
| | | | 257/773 |
| 2018/0033998 A1* | 2/2018 | Kim | H01L 51/5253 |
| 2018/0097051 A1* | 4/2018 | Huang | H01L 51/56 |
| 2018/0267374 A1* | 9/2018 | Long | H01L 29/78618 |
| 2019/0006442 A1* | 1/2019 | Byun | H10K 59/124 |
| 2019/0214442 A1* | 7/2019 | Liu | H01L 51/0005 |

FOREIGN PATENT DOCUMENTS

| | | |
|---|---|---|
| KR | 10-2020-0024979 | 3/2020 |
| KR | 10-2020-0039904 | 4/2020 |

* cited by examiner

DISPLAY DEVICE HAVING A COMPENSATION PATTERN

CROSS-REFERENCE TO RELATED APPLICATION

This application claims priority to and the benefit of Korean Patent Application No. 10-2020-0085384 filed on Jul. 10, 2020 which is hereby incorporated by reference for all purposes as if fully set forth herein.

BACKGROUND

Field

Exemplary implementations of the invention relate generally to a display device and more specifically, to a display device with a uniform sealing area.

Discussion of the Background

A display panel includes an array substrate including a pixel array. The array substrate may be combined with an opposing substrate or an encapsulation substrate to protect the pixel array.

In order to combine the array substrate with the encapsulation substrate, a sealing material such as a glass frit may be disposed between the array substrate and the encapsulation substrate and may be heated by laser.

The above information disclosed in this Background section is only for understanding of the background of the inventive concepts, and, therefore, it may contain information that does not constitute prior art.

SUMMARY

Applicant discovered that a display device may have an optical pattern, which is visually perceived by a user and is caused by the distance differences between an array substrate and an encapsulation substrate of the display device in a sealing area.

Display devices constructed according to the principles and exemplary implementations of the invention provide improved reliability.

In addition, display devices constructed according to the principles and exemplary implementations of the invention are capable of preventing the optical pattern from visually recognized by the user by providing a uniform sealing area, in which an array substrate and an encapsulation substrate are combined by a sealing member, and by reducing the distance differences between the array substrate and the encapsulation substrate thereof.

Additional features of the inventive concepts will be set forth in the description which follows, and in part will be apparent from the description, or may be learned by practice of the inventive concepts.

According to an aspect of the invention, a display device includes: an array substrate including a pixel array disposed in a display area; an encapsulation substrate disposed to face the array substrate; and a sealing member disposed in a sealing area, the sealing member disposed between the array substrate and the encapsulation substrate to combine the array substrate with the encapsulation substrate, wherein the array substrate includes: an organic insulation layer disposed in a first peripheral area between the display area and the sealing area; a power bus line disposed in the first peripheral area, the power bus line including a first wiring layer and a second wiring layer disposed on the first wiring layer, each of the first wiring layer and the second wiring layer overlapping the organic insulation layer; and a compensation pattern disposed under the sealing member and extending along an outer edge of the sealing member, the compensation pattern including a first compensation layer and a second compensation layer, wherein: the first compensation layer is connected to the first wiring layer, and the second compensation layer is disposed on the first compensation layer and connected to the second wiring layer.

Each of the first compensation layer and the second compensation layer may have a multi-layered structure including an aluminum layer.

A thickness of the compensation pattern may be equal to or more than about 10,000 Å.

A distance between an outer edge of the compensation pattern and the outer edge of the sealing member may be equal to or less than about 200 μm.

The compensation pattern may further include a third compensation layer disposed under the first compensation layer.

The array substrate may further include an inorganic insulation layer disposed between the first compensation layer and the third compensation layer.

The first compensation layer may be electrically connected to the third compensation layer by passing through the inorganic insulation layer.

The third compensation layer may include molybdenum.

The third compensation layer may extend along the outer edge of the sealing member.

The compensation pattern may further include a fourth compensation layer disposed under the third compensation layer.

The fourth compensation layer may include a same material as the third compensation layer.

The array substrate may further include an inorganic intermediate layer disposed between the first compensation layer and the second compensation layer and including an inorganic material.

The pixel array may include an organic light-emitting diode.

The power bus line may be configured to supply a power voltage to the organic light-emitting diode.

According to another aspect of the invention, a display device includes: an array substrate including a pixel array disposed in a display area; an encapsulation substrate disposed to face the array substrate; and a sealing member disposed in a sealing area, the sealing member disposed between the array substrate and the encapsulation substrate to combine the array substrate with the encapsulation substrate, wherein the array substrate includes: a power bus line disposed in a first peripheral area between the display area and the sealing area; an upper compensation layer disposed under the sealing member and extending along an outer edge of the sealing member, wherein the upper compensation layer and at least a portion of the power bus line are disposed on a same layer; a lower compensation layer disposed under the upper compensation layer and extending along the upper compensation layer and including a different material from the upper compensation layer; and an inorganic insulation layer disposed between the upper compensation layer and the lower compensation layer.

The upper compensation layer may include aluminum.

The lower compensation layer may include molybdenum.

The upper compensation layer may include a first upper compensation layer and a second upper compensation layer.

The power bus line may include a first wiring layer connected to the first upper compensation layer and a second wiring layer connected to the second upper compensation layer.

The lower compensation layer may include a first lower compensation layer and a second lower compensation layer disposed under the first lower compensation layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
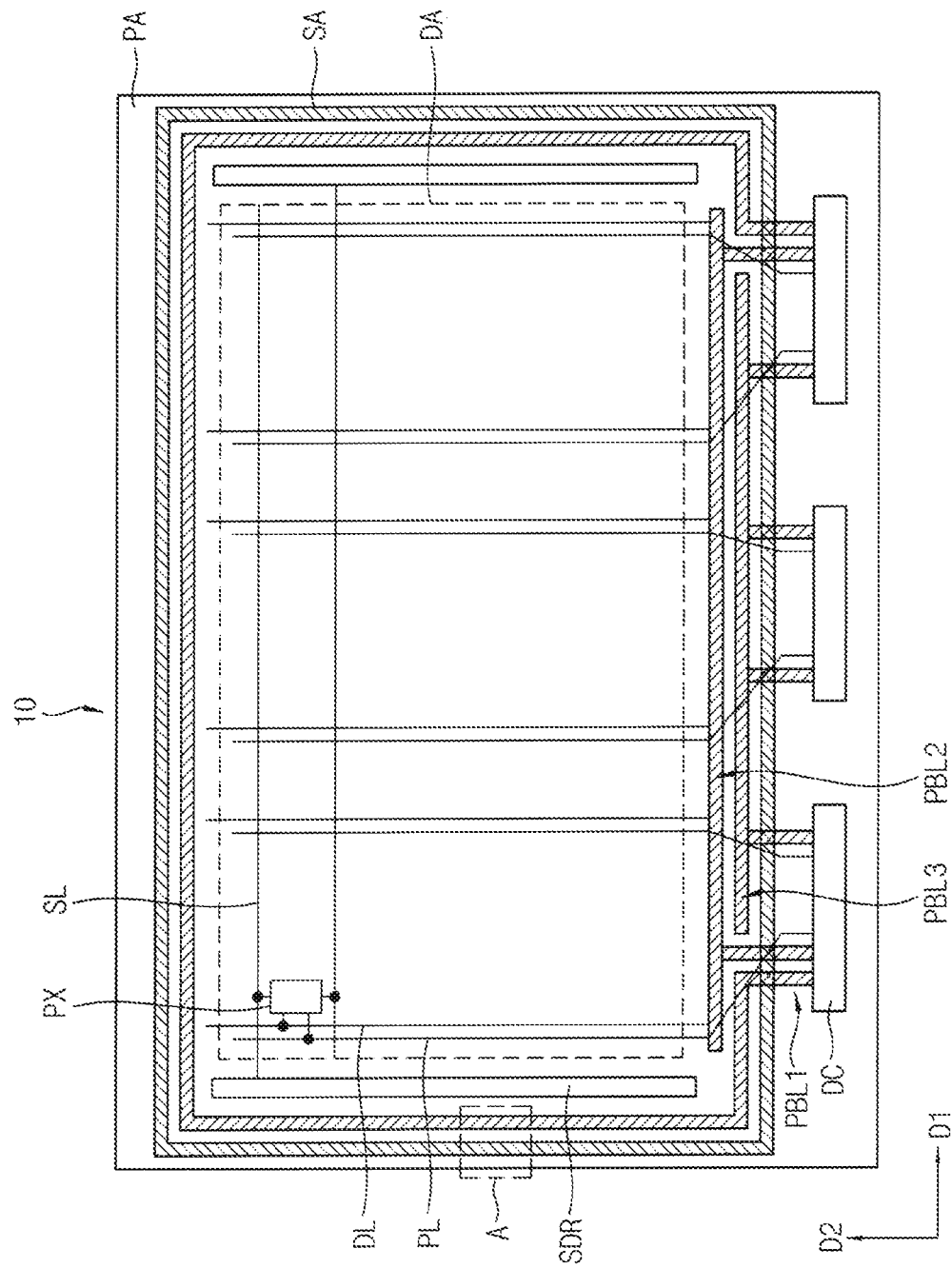
FIG. 1 is a plan view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be is understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the"

are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A display device and a method for manufacturing a display device according to embodiments of the present inventive concepts will be described hereinafter with reference to the accompanying drawings, in which some embodiments are shown.

Figure 2:
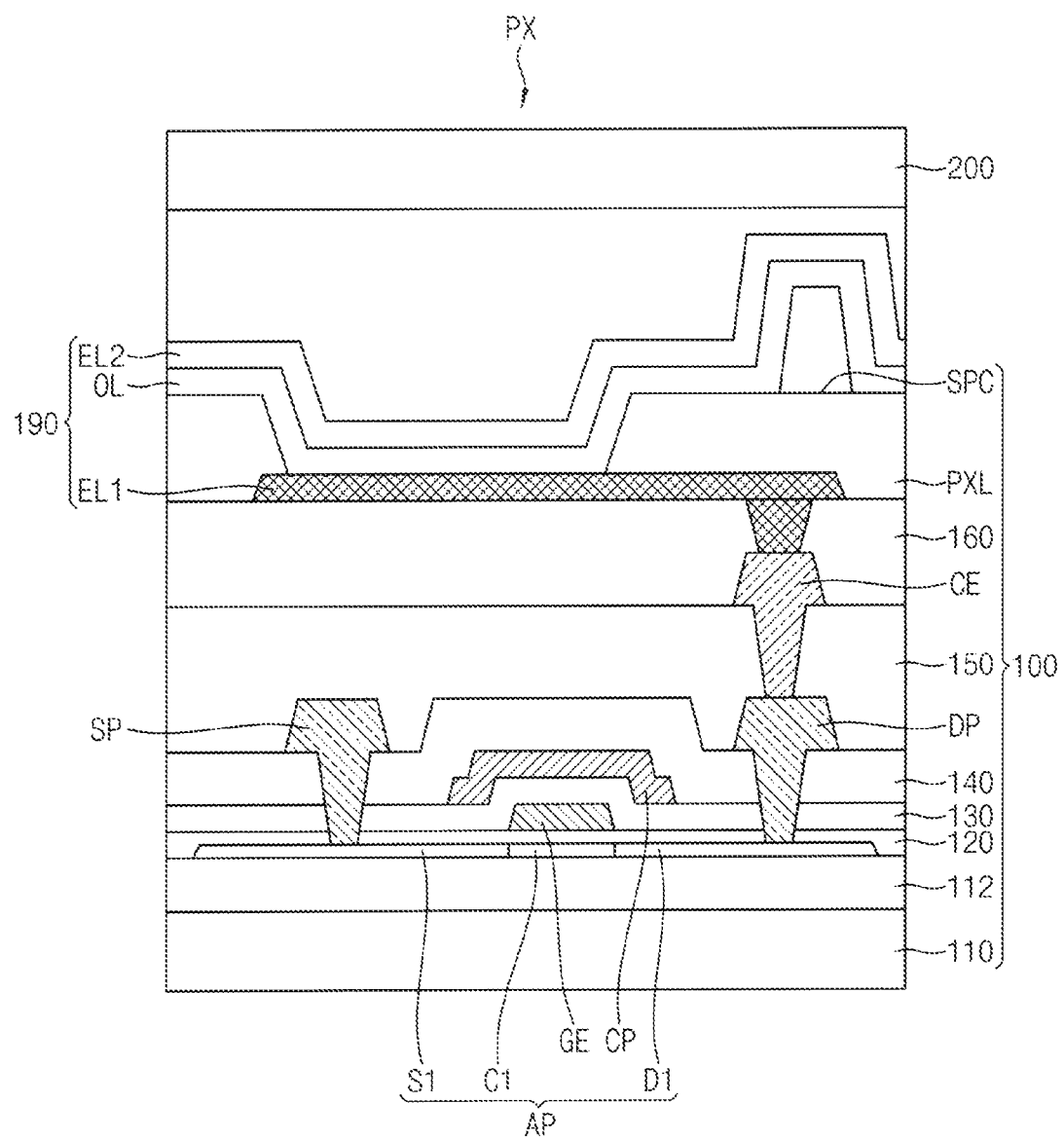
FIG. 2 is a cross-sectional view of a display area of the display device of FIG. 1.
Figure 3:
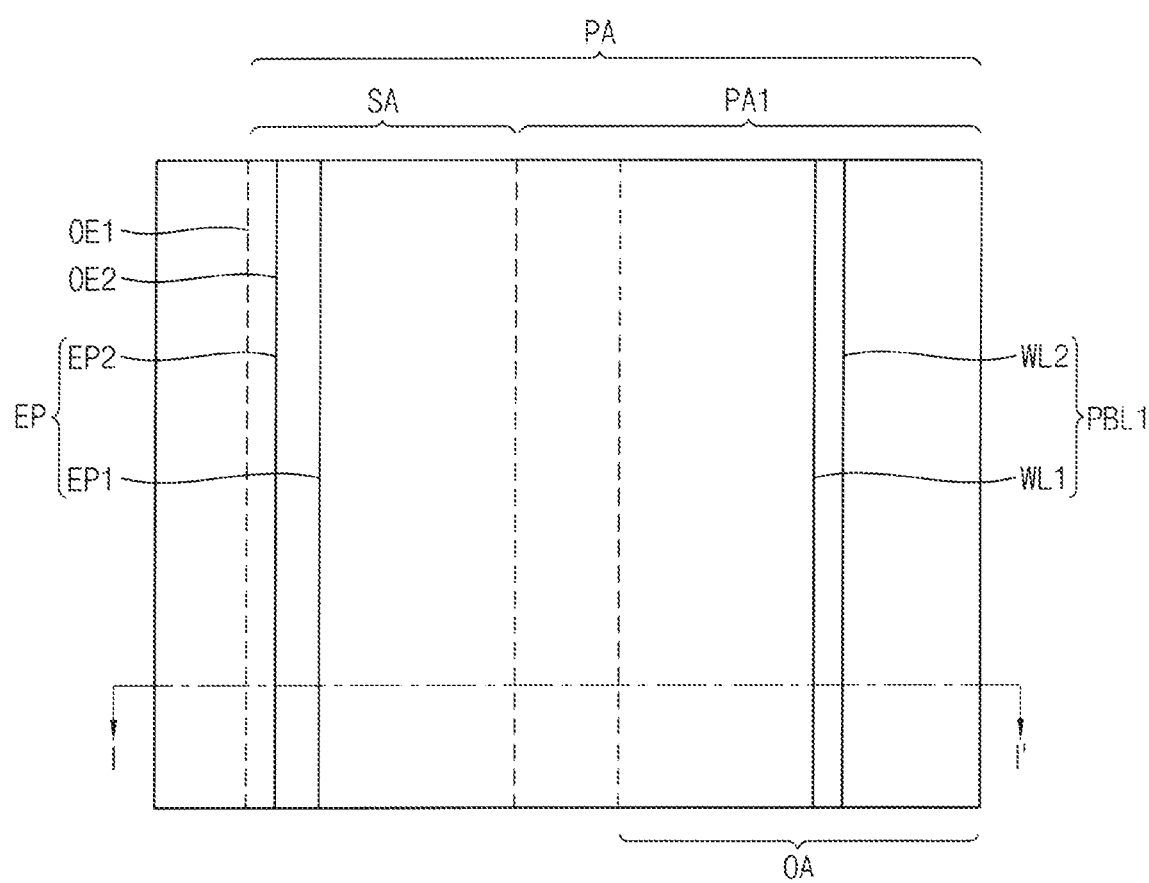
FIG. 3 is an enlarged plan view of the region A of FIG. 1.
Figure 4:
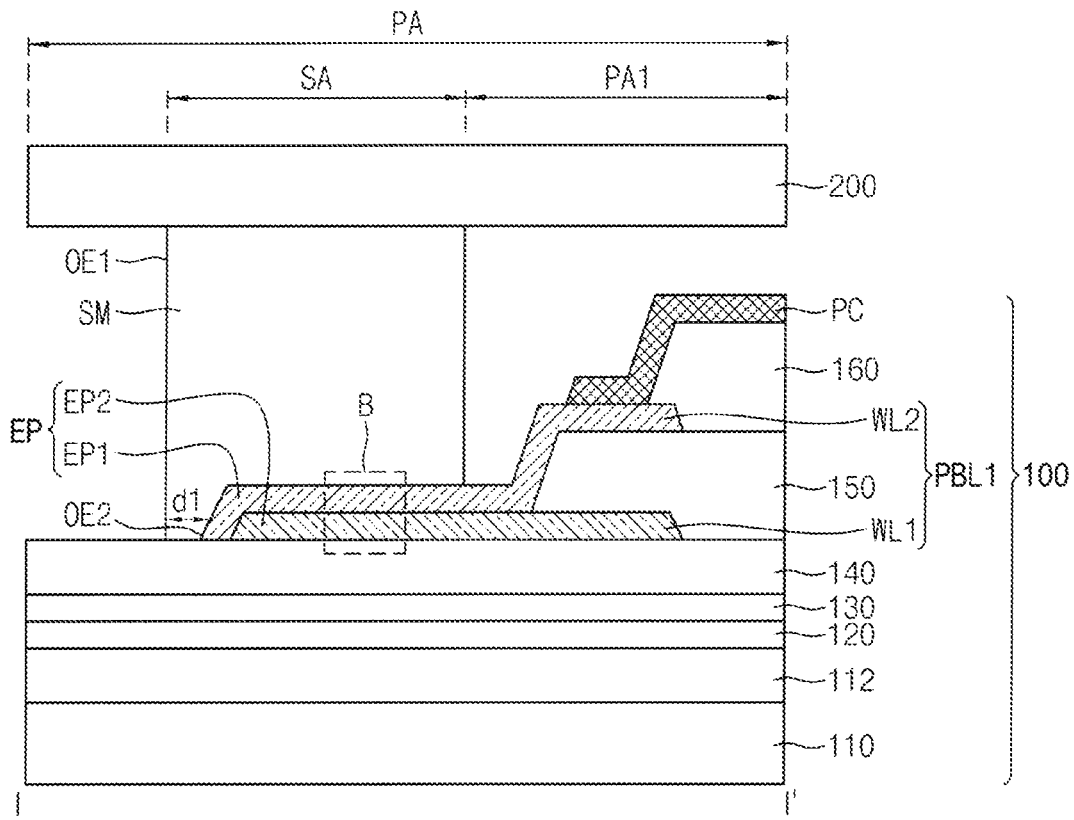
FIG. 4 is a cross-sectional view taken along the line I-I' of FIG. 3.
Figure 5:
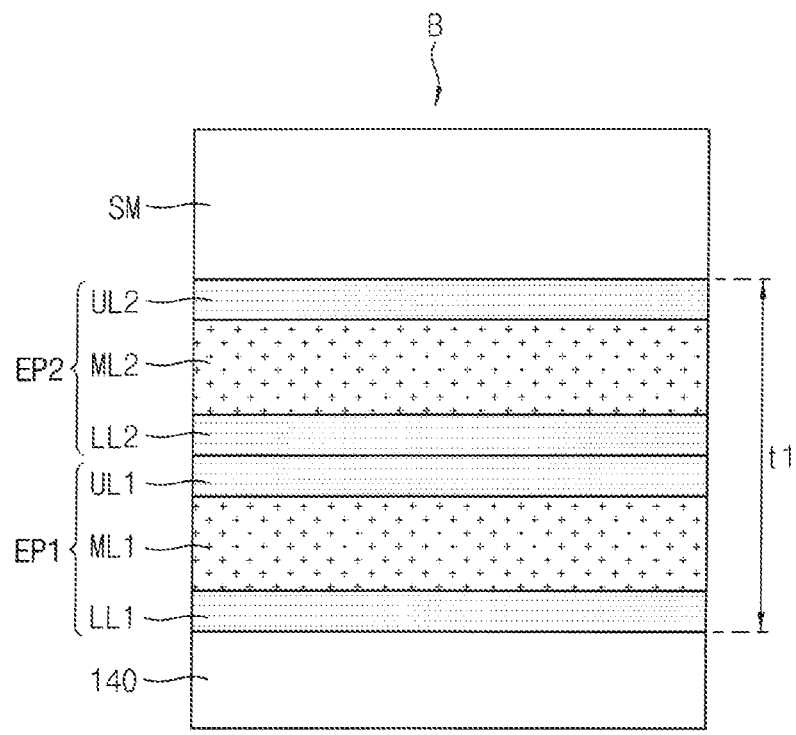
FIG. 5 is an enlarged cross-sectional view of the region B of FIG. 4.

FIG. 1 is a plan view of an exemplary embodiment of a display device constructed according to the principles of the invention. FIG. 2 is a cross-sectional view of the display area of the display device of FIG. 1. FIG. 3 is an enlarged plan view of the region A of FIG. 1. FIG. 4 is a cross-sectional view taken along the line I-I' of FIG. 3. FIG. 5 is an enlarged cross-sectional view of the region B of FIG. 4

Referring to FIG. 1, a display device 10 includes a display area DA and a peripheral area adjacent to the display area DA. For example, the peripheral area may surround the display area DA. The display area DA may generate a light and adjust transmittance of a light provided by an external light source to display an image. The peripheral area may be defined as a non-display area, in which an image is not displayed.

In an exemplary embodiment, the display device 10 may include an organic light-emitting display panel. For example, an array of pixels PX including a light-emitting element may be disposed in the display area DA to generate a light in response to a driving signal. A signal line and a power line may be disposed in the display area DA to transfer a driving signal and a power voltage to the pixels PX. For example, the signal line and the power line may be conductive wiring lines. For example, a gate line GL, a data line DL and a power line PL may be disposed in the display area DA. The gate line GL may extend in a first direction D1 and may provide a gate signal to the pixels PX. The data line DL may extend in a second direction D2 intersecting the first direction D1 and may provide a data signal to the pixels PX. The power line PL may extend in the second direction D2 and may provide a power voltage to the pixels PX.

A transfer line, a circuit part or the like may be disposed in the peripheral area. For example, the transfer line may be a conductive wiring line. The transfer line may transfer a driving signal or a power to the display area DA. The circuit part may generate a driving signal. For example, a scan driver SDR generating the gate signal, a fan-out line for transferring the data signal to the data line DL, a first power bus line PBL1 for transferring a first power voltage to the pixels PX and a second power bus line PBL2 for transferring a second power voltage to the power line PL or the like may be disposed in the peripheral area. For example, the fan-out line, the first power bus line PBL1, the second power bus line PBL2 may be conductive wiring lines.

In an exemplary embodiment, the first power bus line PBL1, the second power bus line PBL2 and the fan-out line may extend to a side of the display device 10. The first power bus line PBL1, the second power bus line PBL2 and the fan-out line may be electrically connected to a driving device DC such as a driving chip, a printed circuit board through a connection pad disposed on the side of the display device 10 to receive a driving signal or a power voltage from the driving device DC. An area where the lines are connected to the driving device DC may be referred as to a connection area.

For example, the display device DC may include a driving chip bonded to a display panel. However, exemplary embodiments are not limited thereto. For example, the display device DC may include a printed circuit board with a driving chip mounted thereto, a flexible printed circuit board with a driving chip mounted thereon, or the like, and may be disposed on a rear surface of the display panel and electrically connected to the lines through a connection member and a connection pad.

In an exemplary embodiment, the first power bus line PBL1 may transfer the first power voltage to a cathode of an organic light-emitting diode. The second power bus line PBL2 may transfer the second power voltage to a driving element of the pixels PX. The driving element may provide a driving voltage to the organic light-emitting diode based on the second power voltage. A constant voltage may be applied to the first power bus line PBL1 and the second power bus line PBL2.

In an exemplary embodiment, the display device 10 may further include a third power bus line PBL3. For example, the third power bus line PBL3 may be a conductive wiring line. The third power bus line PBL3 may transfer the first power voltage to the pixels PX. For example, the first power bus line PBL1 may extend to surround the display area DA. The third power bus line PBL3 may be disposed in an area where the first power bus line PBL1 is not disposed. For example, the second power bus line PBL2 and the third power bus line PBL3 may extend in a first direction D1 on a side of the display device 10. Thus, the first power voltage may be substantially uniformly applied to the pixels in the display device 10 having a longer side extending in the first direction D1.

In an exemplary embodiment, the display device 10 includes a sealing area SA where a sealing member is disposed. The sealing area SA may extend to surround the display area DA.

Referring to FIG. 2, a display device 10 includes an array substrate 100 and an encapsulation substrate 200. An array of pixels PX is disposed in a display area DA of the array substrate 100. Each of the pixels PX may include a driving element disposed on a base substrate 110, and a light-emitting element electrically connected to the driving element. In an exemplary embodiment, the driving element may be an organic light-emitting diode.

A buffer layer 112 may be disposed on the base substrate 110. An active pattern AP may be disposed on the buffer layer 112.

For example, the base substrate 110 may include glass, quartz, sapphire, a polymeric material or the like. In an exemplary embodiment, the base substrate 110 may include a transparent rigid material such as glass.

The buffer layer 112 may prevent or reduce permeation of impurities, humidity or external gas from underneath of the base substrate 110, and may reduce a roughness of an upper surface of the base substrate 110. For example, the buffer layer 112 may include an inorganic material such as oxide, nitride or the like.

A first gate metal pattern including a gate electrode GE may be disposed on the active pattern AP. A first insulation layer 120 may be disposed between the active pattern AP and the gate electrode GE.

A second gate metal pattern including a capacitor electrode pattern CP may be disposed on the gate electrode GE. The capacitor electrode pattern CP may include a capacitor electrode for forming a capacitor, a line for transferring a scan signal or the like.

A second insulation layer 130 may be disposed between the first gate metal pattern and the second gate metal pattern. A third insulation layer 140 may be disposed on the second gate metal pattern.

For example, the active pattern AP may include silicon or a metal oxide semiconductor. In an exemplary embodiment, the active pattern AP may include polycrystalline silicon (e.g., polysilicon), which may be doped with n-type impurities or p-type impurities.

In another exemplary embodiment or in another transistor that is not illustrated, an active pattern may include a metal oxide semiconductor. For example, the active pattern may include two-component compound ($AB_x$), ternary compound ($AB_xC_y$) or four-component compound ($AB_xC_yD_z$), which contains indium (In), zinc (Zn), gallium (Ga), tin (Sn), titanium (Ti), aluminum (Al), hafnium (Hf), zirconium (Zr), magnesium (Mg). For example, the active pattern may include zinc oxide ($ZnO_x$), gallium oxide ($GaO_x$), titanium oxide ($TiO_x$), tin oxide ($SnO_x$), indium oxide ($InO_x$), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

For example, the active pattern AP may include a channel region C1 overlapping the gate electrode GE, a source region S1 and a drain region D1. The source region S1 and the drain region D1 may have a greater conductivity than the channel region C1. For example, the source region S1 and the drain region D1 may be doped by impurities with a higher concentration.

The first insulation layer 120, the second insulation layer 130 and the third insulation layer 140 may each include silicon oxide, silicon nitride, silicon oxynitride or a combination thereof. Furthermore, the first insulation layer 120, the second insulation layer 130 and the third insulation layer 140 may each include an insulating metal oxide such as aluminum oxide, tantalum oxide, hafnium oxide, zirconium oxide, titanium oxide or the like. For example, the first insulation layer 120, the second insulation layer 130 and the third insulation layer 140 may each have a single-layered structure or a multi-layered structure including silicon nitride and/or silicon oxide, or may have different structures from each other.

The first gate metal pattern and the second gate metal pattern may each include a metal, a metal alloy, a metal nitride, a conductive metal oxide or the like. For example, the first gate metal pattern and the second gate metal pattern may each include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

A first source metal pattern may be disposed on the third insulation layer 140. The first source metal pattern may include a source pattern SP and a drain pattern DP, which are electrically connected to the active pattern AP. The source pattern SP and the drain pattern DP may pass through the insulation layers thereunder to contact the source region S1 and the drain region D1 of the active pattern AP, respectively. The first source metal pattern may further include a line for transferring a signal, a power voltage or the like.

A fourth insulation layer 150 may be disposed on the first source metal pattern. A second source metal pattern may be disposed on the fourth insulation layer 150. The second source metal pattern may include a connection electrode CE. For example, the second source metal pattern may further include at least one of a data line and a power line. A fifth insulation layer 160 may be disposed on the second source metal pattern.

The first source metal pattern and the second source metal pattern may each include a metal, a metal alloy, a metal nitride, a conductive metal oxide or the like. For example, the first source metal pattern and the second source metal patterns may each include Au, Ag, Al, Cu, Ni, Pt, Mg, Cr, W, Mo, Ti, Ta or an alloy thereof, and may have a single-layered structure or a multi-layered structure including different metal layers. In an exemplary embodiment, the first source metal pattern and the second source metal patterns may each have a multi-layered structure including aluminum. For example, the first source metal pattern and the second source metal patterns may each have a double-layered structure or a triple-layered structure, which includes an aluminum layer and a titanium layer.

The fourth insulation layer 150 and the fifth insulation layer 160 may include an organic material. For example, the fourth insulation layer 150 and the fifth insulation layer 160 may each include an organic insulation material such as a phenol resin, an acryl resin, a polyimide resin, a polyamide resin, a siloxane resin, an epoxy resin or the like. For example, the fourth insulation layer 150 and the fifth insulation layer 160 may be referred as to a first via insulation layer and a second via insulation layer, or may be referred as to a first organic insulation layer and a second organic insulation layer, respectively.

An organic light-emitting diode 190 may be disposed on the fifth insulation layer 160. The organic light-emitting diode 190 may include a first electrode EL1 electrically connected to the connection electrode CE, an organic light-emitting layer OL disposed on the first electrode EL1 and a second electrode EL2 disposed on the organic light-emitting layer OL. The organic light-emitting layer OL of the organic light-emitting diode 190 may be disposed at least in an opening of a pixel-defining layer PDL disposed on the fifth insulation layer 160. The first electrode EL1 may be a lower electrode of the organic light-emitting diode 190, and the second electrode EL2 may be an upper electrode of the organic light-emitting diode 190.

The first electrode EL1 may function as an anode. For example, the first electrode EL1 may be formed as a transmitting electrode or a reflecting electrode according to an emission type of the display device. When the first electrode EL1 is a transmitting electrode, the first electrode EL1 may include indium tin oxide, indium zinc oxide, zinc tin oxide, indium oxide, zinc oxide, tin oxide or the like. When the first electrode EL1 is a reflecting electrode, the first electrode EL1 may include Au, Ag, Al, Cu, Ni, Pt, Mg, Cr, W, Mo, Ti or a combination thereof, and may have a stacked structure further including the material that may be used for the transmitting electrode. For example, the first electrode EL1 may have a stacked structure of ITO/Ag/ITO.

The pixel-defining layer PDL has the opening overlapping at least a portion of the first electrode EL1. For example, the pixel-defining layer PDL may include an organic insulating material.

The organic light-emitting layer OL may include at least a light-emitting layer, and may further include at least one of a hole injection layer (HIL), a hole transporting layer (HTL), an electron transporting layer (ETL) and an electron injection layer (EIL). The organic light-emitting layer OL may include a low molecular weight organic compound or a polymeric organic compound. For example, the light-emitting layer may have a pattern shape corresponding to each pixels, and at least one of the hole injection layer, a hole transporting layer, an electron transporting layer and an electron injection layer may be formed as a common layer extending continuously over a plurality of pixels in the display area DA.

In an exemplary embodiment, the organic light-emitting layer OL may emit a red light, a green light or a blue light. In another exemplary embodiment, the organic light-emitting layer OL may emit a white light. The organic light-emitting layer OL for emitting a white light may have a multi-layer structure including a red light-emitting layer, a green light-emitting layer and a blue light-emitting layer, or a single-layer structure including a mixture of a red light-emitting material, a green light-emitting material and a blue light-emitting material.

The second electrode EL2 may function as a cathode. The second electrode EL2 may be formed as a transmitting electrode or a reflecting electrode according to an emission type of the display device. For example, the second electrode EL2 may include a metal, a metal alloy, a metal nitride, a metal fluoride, a conductive metal oxide or a combination thereof.

For example, the second electrode EL2 may be formed as a common layer extending continuously over a plurality of pixels in the display area DA.

An encapsulation substrate 200 is disposed on the organic light-emitting diode 190. For example, the encapsulation substrate 200 may include glass, quartz, sapphire, a polymeric material or the like. In an exemplary embodiment, the encapsulation substrate 200 may include a transparent rigid material such as glass.

For example, a spacer SPC may be disposed under the encapsulation substrate 200 to support the encapsulation substrate 200. In an exemplary embodiment, the spacer SPC may be disposed on the pixel-defining layer PDL, and may be formed in the same process as the process forming the pixel-defining layer PDL by using a half-tone light-exposure or the like.

A space between the encapsulation substrate 200 and the organic light-emitting diode 190 may have a vacuum state or may be filled with a gas or a sealing material. The sealing material may include an organic layer, an inorganic layer or a combination thereof.

Referring to FIGS. 3 and 4, the peripheral area PA may include the sealing area SA. An area between the sealing area SA and the display area DA may be referred as to a first peripheral area PA1.

For example, the buffer layer 112, the first insulation layer 120, the second insulation layer 130 and the third insulation layer 140, which extend from the display area DA, may be disposed in the peripheral area PA. The sealing area SA may be defined by an area where the sealing member SM is disposed. In an exemplary embodiment, an organic layer may be removed in the sealing area SA. For example, the fourth insulation layer 150 and the fifth insulation layer 160 may be removed in the sealing area SA. Thus, the fourth insulation layer 150 and the fifth insulation layer 160 may be spaced apart from the sealing area SA. An area where the organic insulation layer is disposed may be referred as to an organic layer area OA.

The first power bus line PBL1 may be disposed in the first peripheral area PA1. For example, at least a portion of the first power bus line PBL1 may overlap the organic layer area OA.

In an exemplary embodiment, the power bus lines may have a double-wiring structure. For example, the first power bus line PBL1 may include a first wiring layer WL1 and a second wiring layer WL2, which are disposed in the first peripheral area PA1. The second wiring layer WL2 may be disposed on the first wiring layer WL1. A portion of the second wiring layer WL2 may be disposed on the fourth insulation layer 150. For example, the fourth insulation layer 150 may be disposed between the first wiring layer WL1 and the second wiring layer WL2 in at least a portion of the first peripheral area PA1.

The fifth insulation layer 160 may be disposed on the fourth insulation layer 150 in the first peripheral area PA1. A power connection line PC may be disposed on the fifth insulation layer 160. The power connection line PC may be electrically connected to the second wiring layer WL2 of the first power bus line PBL1, and may transfer a power voltage of the second electrode EL2 of the organic light-emitting diode 190. For example, the power connection line PC may be formed from the same layer as the first electrode EL1 of the organic light-emitting diode 190.

The second power bus line PBL2 and the third power bus line PBL3 may each have a double-wiring structure similar to that of the first power bus line PBL1.

In an exemplary embodiment, since the power bus lines have a double-wiring structure, an entire resistance of the power bus lines may be reduced, and reliability of the power bus lines may be maintained when the power bus line are partially damaged.

In an exemplary embodiment, the array substrate 100 includes a compensation pattern EP overlapping at least a portion of the sealing member SM. The compensation pattern EP may be disposed under the sealing member SM.

In an exemplary embodiment, the compensation pattern EP may be formed from the first power bus line PBL1, and may be continuously connected to the first power bus line PBL1. For example, the compensation pattern EP may be defined as a portion of the first power bus line PBL1.

For example, the compensation pattern EP may include a first compensation layer EP1 and a second compensation layer EP2. The second compensation layer EP2 may be disposed under the first compensation layer EP1. In an exemplary embodiment, the second compensation layer EP2 may cover an outer side surface of the first compensation layer EP1. The second compensation layer EP1 may contact the sealing member SM. The first wiring layer WL1 and the first compensation layer EP1 may be disposed in the same layer, and may be continuously connected to each other. The second wiring layer WL2 and the second compensation layer EP2 may be disposed on the same layer (e.g., the third insulation layer 140), and may be continuously connected to each other.

For example, the first wiring layer WL1 and the first compensation layer EP1 may be referred as to a lower conductive layer or a first conductive layer. The second wiring layer WL2 and the second compensation layer EP2 may be referred as to an upper conductive layer or a second conductive layer. For example, portions of the lower conductive layer and the upper conductive layer, which overlap the sealing member SM, may define the compensation pattern EP, and portions of the lower conductive layer and the upper conductive layer, which are disposed in the first peripheral area PA1, may define the first power bus line PBL1.

In an exemplary embodiment, the compensation pattern EP may be spaced apart from an outer edge OE1 of the sealing member SM. For example, an outer edge OE2 of the compensation pattern EP may be disposed in the sealing area SA, in a plan view. The outer edge OE2 of the compensation pattern EP may extend along the outer edge OE1 of the sealing member SM.

For example, each of the first compensation layer EP1 and the second compensation layer EP2 may surround at least three sides of the display area DA like the first power bus line PBL1. For example, the compensation pattern EP may extend in the first direction D1 or in the second direction D2 intersecting the first direction D1 along the sealing area SA.

An overlapping area, in which the compensation pattern EP overlaps the sealing member SM, may be preferred to be larger in order to compensate for a height of the array substrate 100 in the sealing area SA. For example, the size of the overlapping area, in which the compensation pattern EP overlaps the sealing member SM, may be at least 50%, at least 70% or at least 80% of the size of the sealing member SM in a plan view.

When the compensation pattern EP may be exposed to an exterior out of the sealing area SA, the compensation pattern EP may be damaged by corrosion or the like. Thus, the outer edge OE2 of the compensation pattern EP may be preferably spaced apart from the outer edge OE1 of the sealing member SM so that the compensation pattern EP may not be exposed to exterior. For example, a distance d1 between the outer edge OE2 of the compensation pattern EP and the outer edge OE1 of the sealing member SM may be equal to or less than about 200 μm. In an exemplary embodiment, a distance d1 between the outer edge OE2 of the compensation pattern EP and the outer edge OE1 of the sealing member SM may be about 100 μm to about 200 μm. Thus, the sealing member SM may cover an outer side surface of the compensation pattern EP, and may contact the third insulation layer 140 under the compensation pattern EP.

In an exemplary embodiment, the first wiring layer WL1 and the first compensation layer EP1 may be formed from the same layer as the first source metal pattern. The second wiring layer WL2 and the second compensation layer EP2 may be formed from the same layer as the second source metal pattern.

For example, the first compensation layer EP1 and the second compensation layer EP1 may each include an aluminum layer and a titanium layer. For example, as illustrated in FIG. 5, the first compensation layer EP1 may include an upper layer UL1, a lower layer LL1 and an intermediate layer ML1 disposed between the upper layer UL1 and the lower layer LL1. The second compensation layer EP2 may include an upper layer UL2, a lower layer LL2 and an intermediate layer ML2 disposed between the upper layer UL2 and the lower layer LL2. The upper layers UL1 and UL2 and the lower layers LL1 and LL2 may include titanium. The intermediate layers ML1 and ML2 may include aluminum.

For example, the thickness of each of the upper layers UL1 and UL2 and the lower layers LL1 and LL2 may be about 100 Å to about 1,000 Å. The thickness of the intermediate layers ML1 and ML2 may be about 5,000 Å to about 10,000 Å. For example, an entire thickness of the compensation pattern EP may be equal to or more than about 10,000 Å. For example, an entire thickness of the compensation pattern EP may be about 10,000 Å to about 20,000 Å.

The array substrate 100 and the encapsulation substrate 200 may be spaced apart from each other by the spacer SPC and the sealing member SM. It may be preferred that the sealing member SM has a proper thickness according to a height of a pixel structure, in order to uniformly maintain a distance between the array substrate 100 and the encapsulation substrate 200. However, when a required thickness of the sealing member SM is increased, the actual thickness (e.g., implemented thickness) of the sealing member SM may not satisfy or meet the required thickness of the sealing member SM, because it is hard to increase the actual thickness of the sealing member SM by liquidity of glass frit or the like, which may be used to form the sealing member SM. When the actual thickness of the sealing member SM is less than the required thickness of the sealing member SM, an optical pattern, for example, Newton ring, which is caused by bending or curving of the encapsulation substrate 200 or the like, may be visually recognized by an external user.

According to an exemplary embodiment, since the compensation pattern EP is disposed under the sealing member SM, the required thickness of the sealing member SM for maintaining a uniform cell gap may be reduced (e.g., by the thickness of the compensation pattern EP). Thus, an optical pattern, which is caused by bending or curving of the encapsulation substrate 200 or the like, may be prevented from being visually perceived.

Furthermore, the compensation pattern EP may reflect a laser, which is used for sintering a glass frit, in the process of forming the sealing member SM such that the sintering efficiency of the glass frit may be improved.

FIGS. 6A, 6B, 7A, 7B, 8A, 8B and 9 are cross-sectional views illustrating a method for manufacturing a display device according to an exemplary embodiment. Particularly, FIGS. 6A, 7A and 8A may illustrate a pixel area, and FIGS. 6B, 7B, 8B and 9 may illustrate a sealing area and a peripheral area adjacent thereto.

Figure 6A:
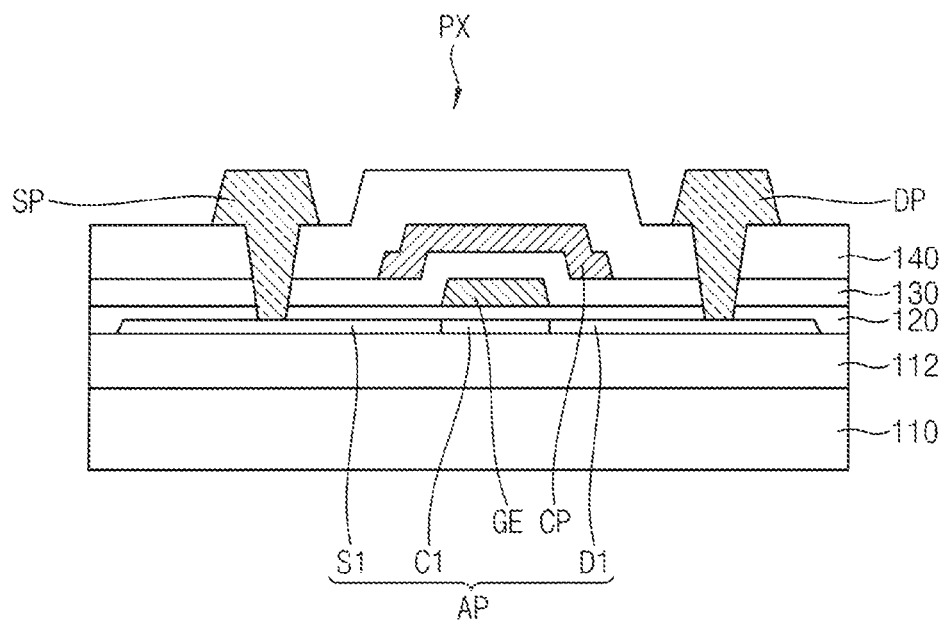
FIGS. 6A, 6B, 7A, 7B, 8A, 8B and 9 are cross-sectional views illustrating a method of manufacturing the display device of FIG. 1.
Figure 6B:
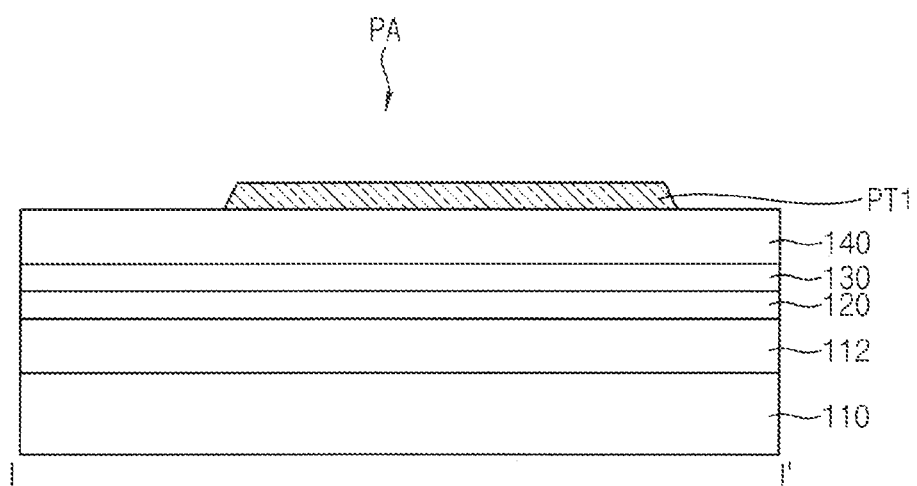

Referring to FIGS. 6A and 6B, a buffer layer 112 is formed on a base substrate 110. An active pattern AP is formed on the buffer layer 112 in a pixel area PX. A first insulation layer 120 is formed on the active pattern AP. A first gate metal patter including a gate electrode GE is formed on the first insulation layer 120. A second insulation layer 130 is formed on the first gate metal pattern. A second gate metal pattern including a capacitor electrode pattern CP is formed on the second insulation layer 130. A third insulation layer 140 is formed on the second gate metal pattern.

The insulation layers are patterned to form contact holes exposing the active pattern AP. After a first source metal layer is formed on the third insulation layer 140, the first source metal layer is patterned to form a first source metal pattern including a source pattern SP and a drain pattern DP. The source pattern SP and the drain pattern DP may be electrically connected to the active pattern AP.

The buffer layer 112, the first insulation layer 120, the second insulation layer 130 and the third insulation layer 140 may extend into the peripheral area PA. The first source metal pattern may further include a first peripheral pattern PT1 disposed in the peripheral area PA.

Figure 7A:
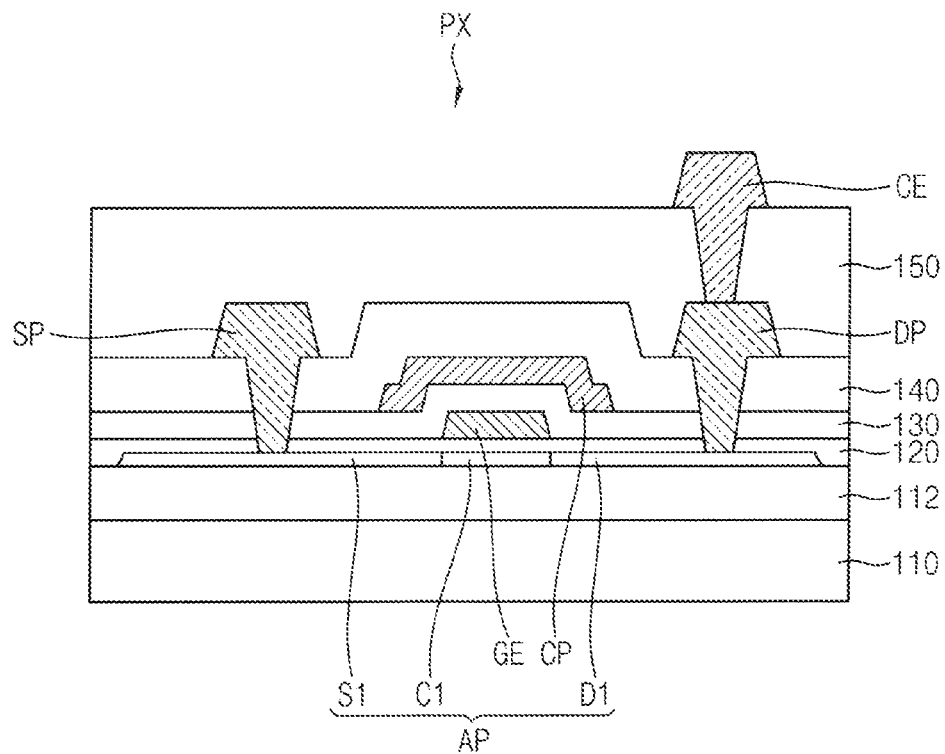
Figure 7B:
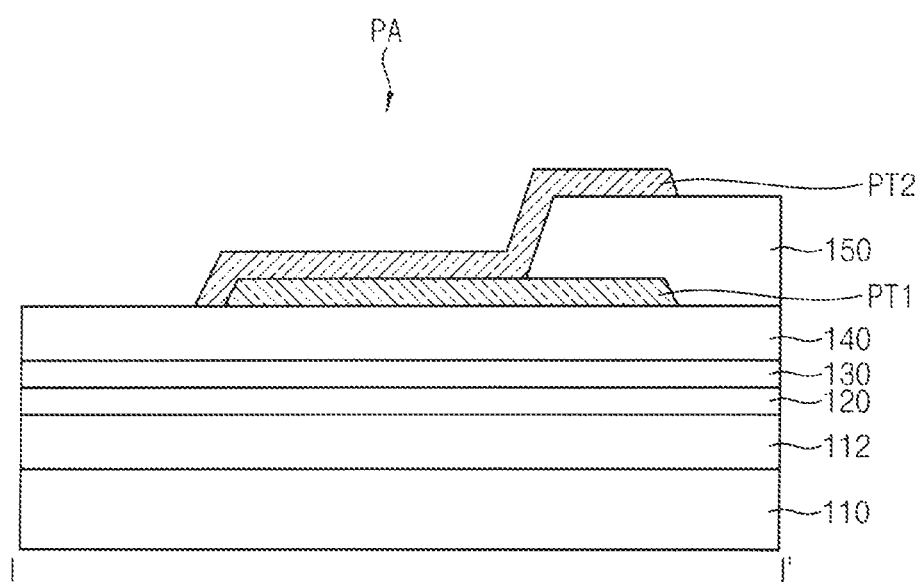

Referring to FIGS. 7A and 7B, a fourth insulation layer 150 is formed to cover the first source metal pattern. In an exemplary embodiment, the fourth insulation layer 150 is partially disposed in the peripheral area PA. For example, the fourth insulation layer 150 may partially cover the first peripheral pattern PT1 in the peripheral area PA.

After a second source metal layer is formed on the fourth insulation layer 150, the second source metal layer is patterned to form a second source metal patter including a connection electrode CE. The connection electrode CE may be electrically connected to the drain pattern DP.

The second source metal pattern may include a second peripheral pattern PT2 disposed in the peripheral area PA. The second peripheral pattern PT2 may overlap the first peripheral pattern PT1, and a portion of the second peripheral pattern PT2 may be disposed on the fourth insulation layer 150 in the peripheral area PA. The first power bus line PBL1 and the compensation pattern EP, which are illustrated in FIG. 4, may be defined from the first peripheral pattern PT1 and the second peripheral pattern PT2.

Figure 8A:
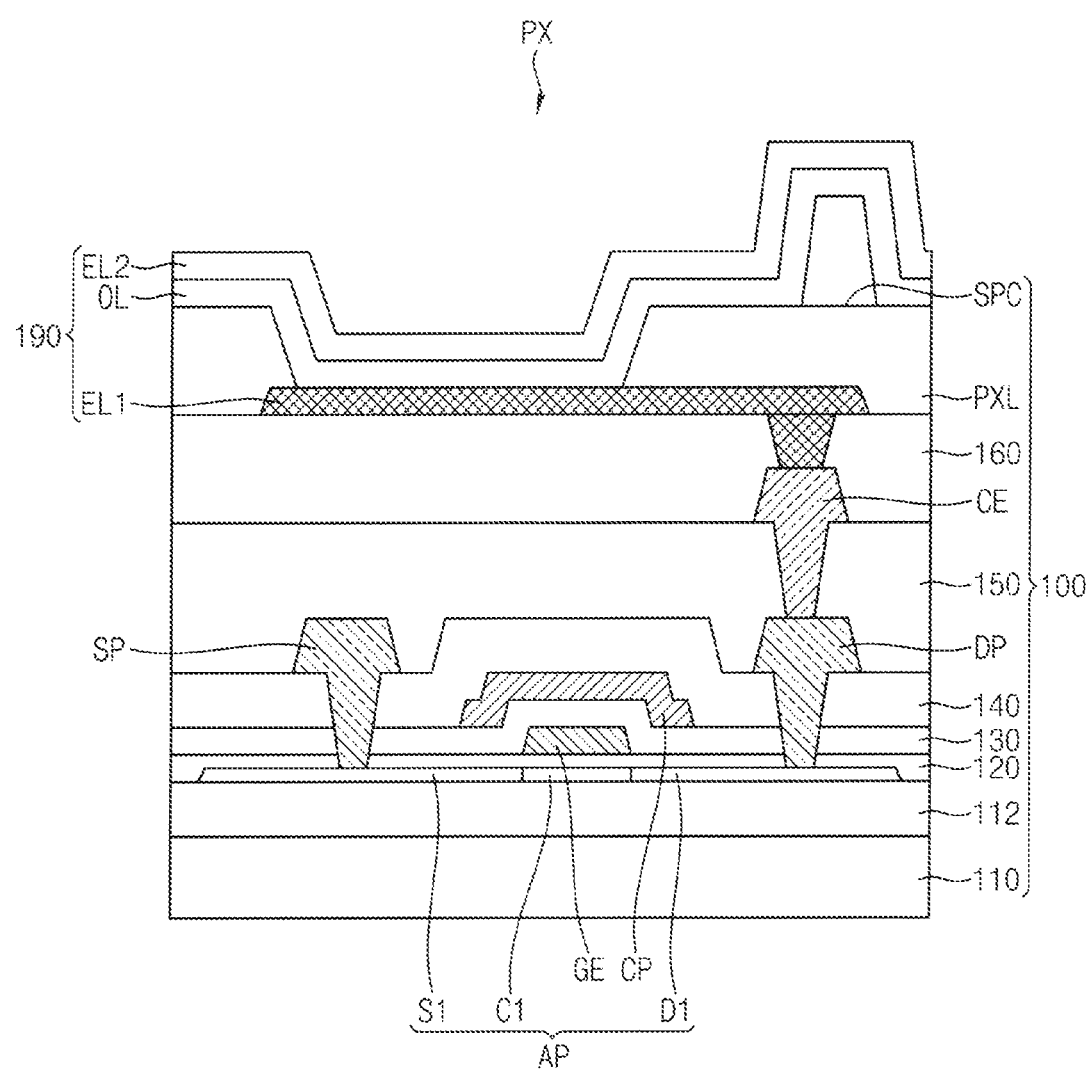
Figure 8B:
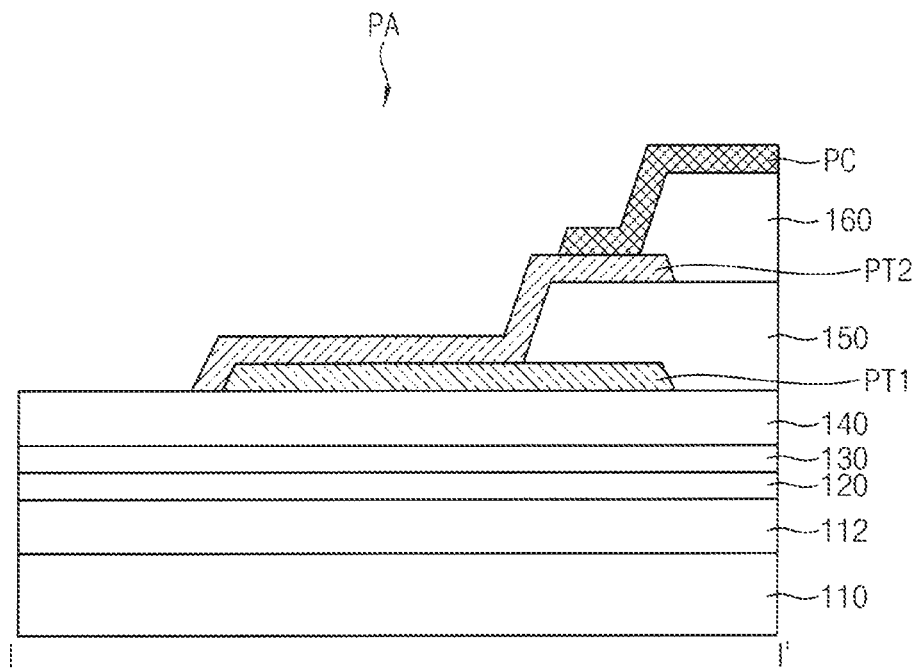

Referring to FIGS. 8A and 8B, a fifth insulation layer 160 is formed to cover the second source metal pattern in the pixel area PX. In an exemplary embodiment, the fifth insulation layer 160 is partially disposed in the peripheral area PA. For example, the fifth insulation layer 160 may be disposed on the fourth insulation layer 150 in the peripheral area PA, and may partially cover the second peripheral pattern PT2.

A first electrode EL1 of an organic light-emitting diode 190 is formed on the fifth insulation layer 160. A pixel-defining layer PDL including an opening, which overlaps at least a portion of the first electrode EL1, is formed on the fifth insulation layer 160. A spacer SPC is formed on the pixel-defining layer PDL. The spacer SPC may include the same material as the pixel-defining layer PDL, and the space SPC and the pixel-defining layer PDL may be formed by the same process.

An organic light-emitting layer OL and a second electrode EL2 are formed on the first electrode EL1.

A power connection line PC, which is disposed in the peripheral area PA, may be formed from the same layer as the first electrode EL1. For example, the power connection line PC may be a conductive wiring line. The power connection line PC may be electrically connected to the second electrode EL2.

Figure 9:
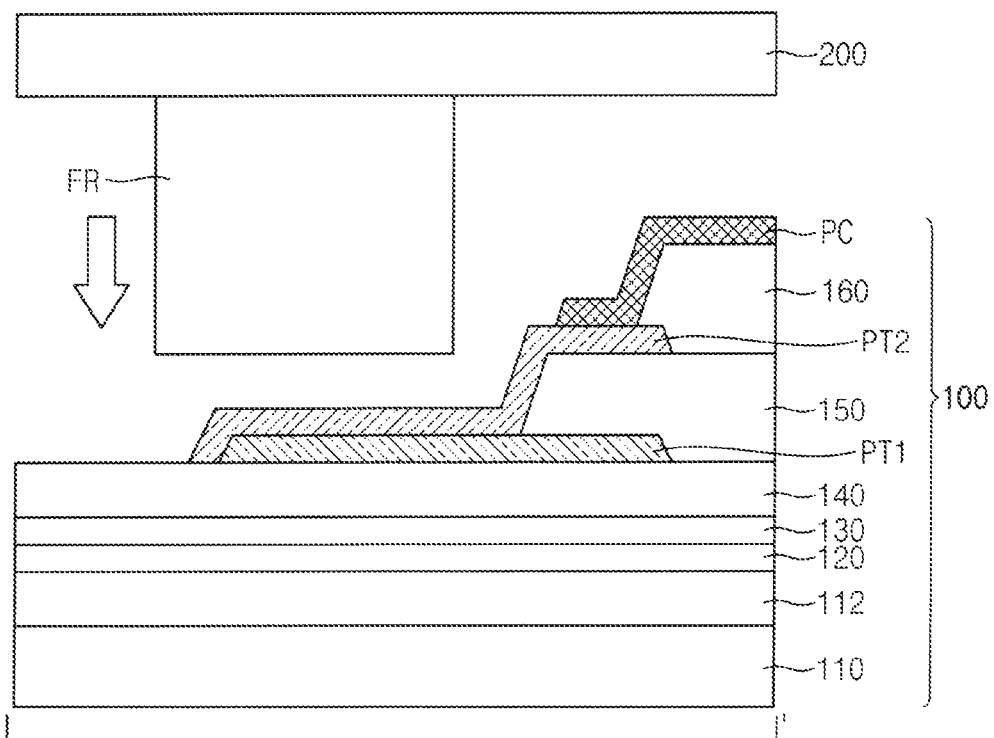

Referring to FIG. 9, an array substrate including the organic light-emitting diode 190 is combined with an encapsulation substrate 200.

In an exemplary embodiment, a sealing material FR is provided between the array substrate 100 and the encapsulation substrate 200 in the peripheral area PA.

For example, the sealing material FR may be combined with a surface of the encapsulation substrate 200. However, exemplary embodiments are not limited thereto. For example, after the sealing material FR is provided on the array substrate 100, the encapsulation substrate 200 may be disposed on the sealing material FR. For example, a frit past or the like is coated on a sealing area by screen printing, which uses a mask including an opening corresponding to the sealing area, to provide the sealing material FR on the array substrate 100.

For example, the sealing material FR may be heated by heat, ultraviolet ray (UV), laser or the like while the sealing material FR contacts the array substrate 100 and the encapsulation substrate 200. As a result, the array substrate 100 is combined with the encapsulation substrate 200, and the sealing material FR is sintered to form the sealing member.

For example, the sealing material FR may include a glass frit. For example, the glass frit may include an oxide powder, a binder and a solvent. For example, the oxide powder may include lead oxide (PbO), silicon oxide ($SiO_2$), zinc oxide (ZnO), bismuth oxide ($Bi_2O_3$), boron oxide ($B_2O_3$, $B_2O_8$), iron oxide ($Fe_2O_3$), aluminum oxide ($Al_2O_3$) or a combination thereof.

In an exemplary embodiment, since the compensation pattern EP is provided under the sealing member, a uniform distance between the array substrate 100 and the encapsulation substrate may be maintained in the sealing area or in the peripheral area. Thus, an optical pattern, which is caused by bending or curving of the encapsulation substrate or the like, may be prevented from being visually perceived.

Figure 10:
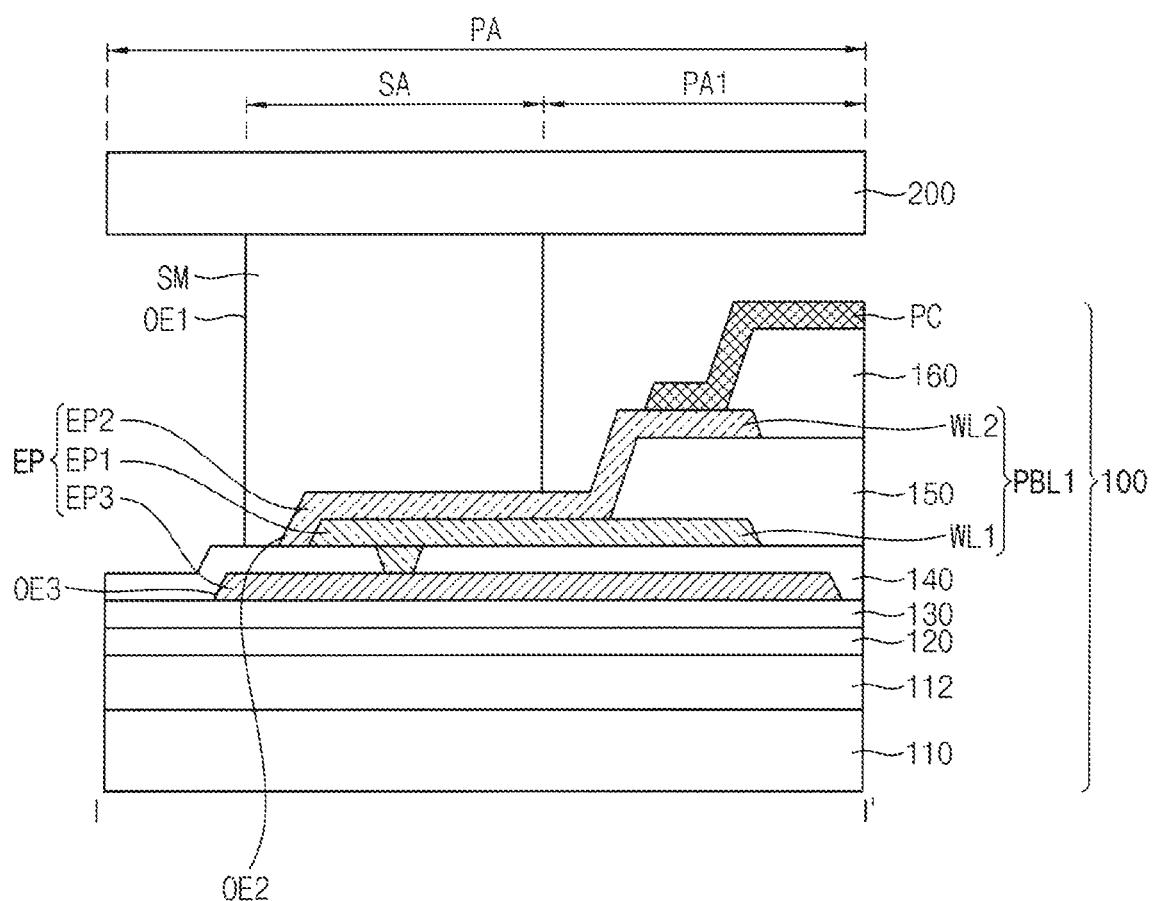
FIGS. 10, 11, and 12 are cross-sectional views of the sealing areas of the display device of FIG. 1 illustrating other exemplary embodiments of the display device of FIG. 1.
Figure 11:
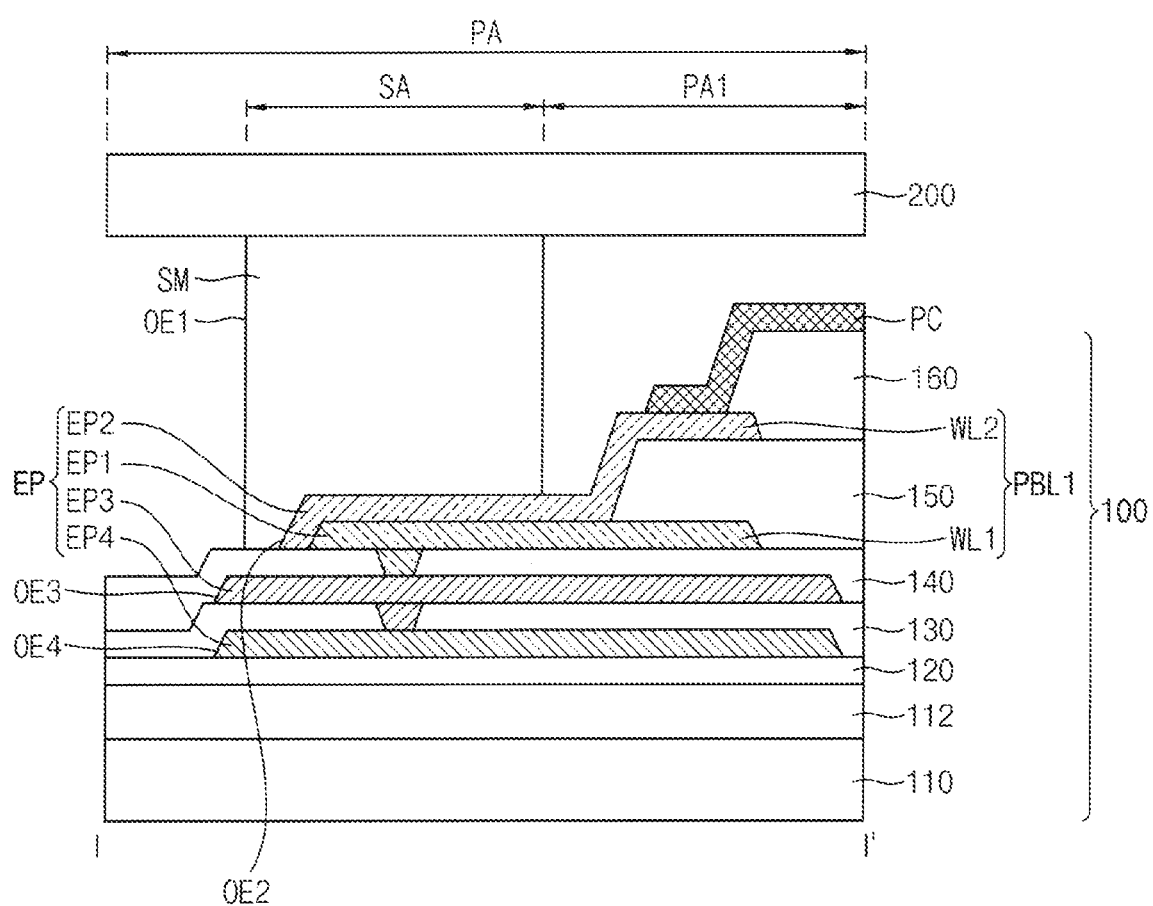
Figure 12:
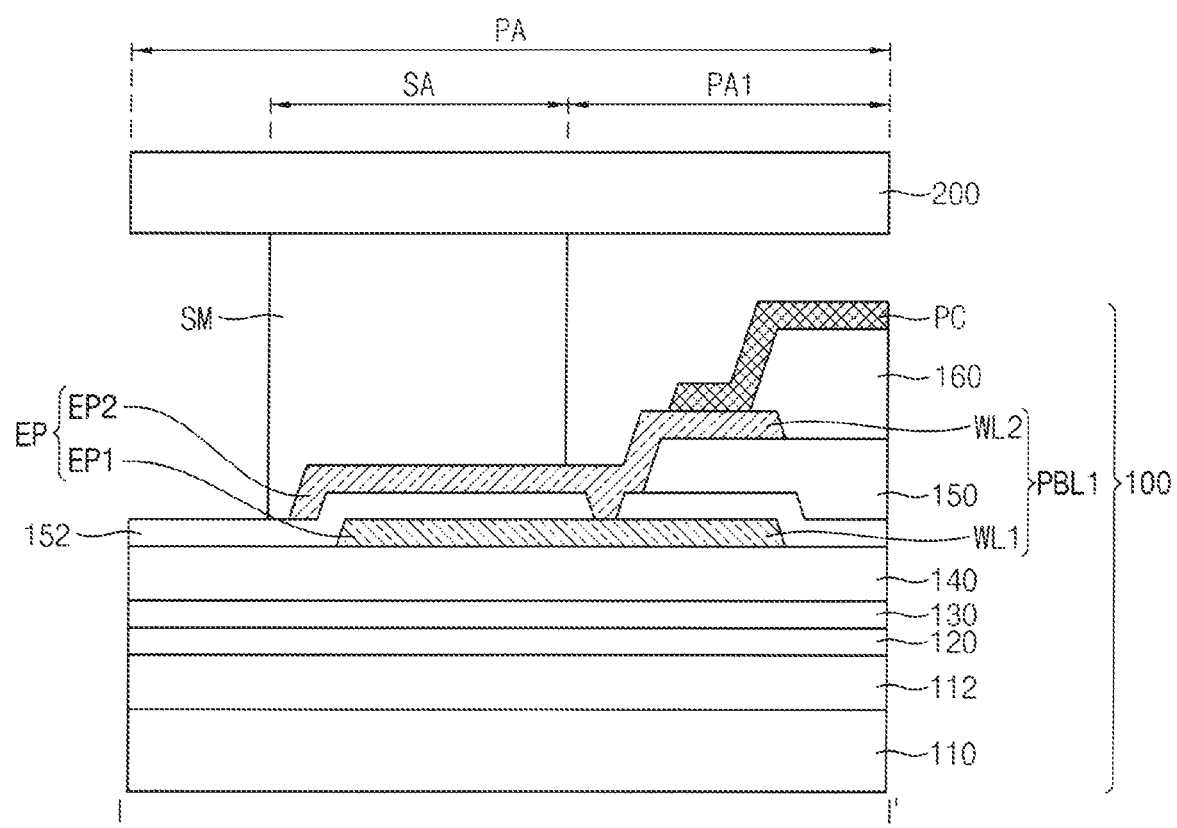

FIGS. 10, 11, and 12 are cross-sectional views of the sealing areas of the display device of FIG. 1 illustrating other exemplary embodiments of the display device of FIG. 1.

Referring to FIG. 10, a sealing member SM, a first power bus line PBL1 and a compensation pattern EP are disposed in a peripheral area PA of a display device. The compensation pattern EP is disposed under the sealing member SM, and overlaps at least a portion of the sealing member SM.

In an exemplary embodiment, the compensation pattern EP includes a first compensation layer EP1, a second compensation layer EP2 and a third compensation layer EP3. The first compensation layer EP1 may be formed from the same layer as a first wiring layer WL1 of the first power bus line PBL1. The second compensation layer EP2 is disposed on the first compensation layer EP1, and may be formed from the same layer as a second wiring layer WL2 of the first power bus line PBL1. The third compensation layer EP is disposed under the first compensation layer EP1, and may be formed from the same layer as a second gate metal pattern in a display area. For example, the third compensation layer EP3 may have a single-layered structure or a multi-layered structure, which includes molybdenum. The third compensation layer EP3 may extend along the sealing member SM to surround at least a portion of the display area. For example, the third compensation layer EP3 may extend from the first peripheral area PA1 to the sealing area SA. An outer edge OE3 of the third compensation layer EP3 may extend beyond the sealing area SA.

A third insulation layer 140 extending from the display area may be disposed between the third compensation layer EP3 and the first compensation layer EP1. In an exemplary embodiment, the first compensation layer EP1 may be electrically connected to the third compensation layer EP3 by passing through the third insulation layer 140. Thus, a power voltage may be applied to the third compensation layer EP3 from the first power bus line PBL1. However, exemplary embodiments are not limited thereto. For example, the third compensation layer EP3 may be in a floating state.

Referring to FIG. 11, a compensation pattern EP overlapping a sealing member SM includes a first compensation layer EP1, a second compensation layer EP2, a third compensation layer EP3 and a fourth compensation layer EP4. The first compensation layer EP1 may be formed from the same layer as a first wiring layer WL1 of the first power bus line PBL1. The second compensation layer EP2 is disposed on the first compensation layer EP1, and may be formed from the same layer as a second wiring layer WL2 of the first power bus line PBL1. The third compensation layer EP is disposed under the first compensation layer EP1, and may be formed from the same layer as a second gate metal pattern in a display area. For example, a third insulation layer 140 extending from the display area may be disposed between the third compensation layer EP3 and the first compensation layer EP1. The fourth compensation layer EP4 is disposed under the third compensation layer EP3, and may be formed from the same layer as a first gate metal pattern in the display area. For example, the third compensation layer EP3 and the fourth compensation layer EP4 may each have a single-layered structure or a multi-layered structure, which includes molybdenum. The third compensation layer EP3 and the fourth compensation layer EP4 may extend along the sealing member SM to surround at least a portion of the display area. For example, the third compensation layer EP3 and the fourth compensation layer EP4 may extend from the first peripheral area PA1 to the sealing area SA. Outer edges OE3 and OE4 of the third compensation layer EP3 and the fourth compensation layer EP4 may extend beyond the sealing area SA.

For example, a second insulation layer 130 extending from the display area may be disposed between the third compensation layer EP3 and the fourth compensation layer EP4.

In an exemplary embodiment, the first compensation layer EP1 may be electrically connected to the third compensation layer EP3 by passing through the third insulation layer 140. The third compensation layer EP3 may be electrically connected to the fourth compensation layer EP4 by passing through the second insulation layer 130. Thus, a power voltage may be applied to the third compensation layer EP3 and the fourth compensation layer EP4 from the first power bus line PBL1.

However, exemplary embodiments are not limited thereto. For example, at least one of the third compensation layer EP3 and the fourth compensation layer EP4 may be in a floating state.

For example, the first compensation layer EP1 and the second compensation layer EP2 may be referred as to a first upper compensation layer and a second upper compensation layer, respectively. The third compensation layer EP3 and the fourth compensation layer EP4 may be referred as to a first lower compensation layer and a second lower compensation layer, respectively.

According to exemplary embodiments, a compensation layer may be added to increase the thickness of the compensation pattern EP and the thickness of an array substrate 100 in a sealing area SA.

Referring to FIG. 12, a compensation pattern EP overlapping a sealing member SM includes a first compensation layer EP1 and a second compensation layer EP2. An inorganic intermediate layer 152 may be disposed between the first compensation layer EP1 and the second compensation layer EP2. For example, the inorganic intermediate layer 152 may include silicon oxide, silicon nitride, silicon oxynitride or a combination thereof.

For example, the first compensation layer EP1 may be electrically connected to the second compensation layer EP2 by passing through the inorganic intermediate layer 152.

The above exemplary embodiments provide an organic-light emitting display device. However, exemplary embodiments are not limited thereto. For example, exemplary embodiments may be applied for other display devices such as a liquid crystal display device, a electroluminescent display device, a micro LED display device or the like.

Exemplary embodiments may be applied to various display devices. For example, embodiment may be applied to vehicle-display device, a ship-display device, an aircraft-display device, portable communication devices, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings and aspects of the present inventive concepts. Accordingly, all such modifications are intended to be included within the scope of the present inventive concept. Therefore, it is to be understood that the foregoing is illustrative of various embodiments and is not to be construed as limited to the specific embodiments disclosed, and that modifications to the disclosed embodiments, as well as other embodiments, are intended to be included within the scope of the present inventive concepts, as set forth in the following claims and equivalents thereof.

What is claimed is:

1. A display device comprising:
an array substrate comprising a pixel array disposed in a display area, the pixel array including a transistor and an organic light-emitting diode electrically connected to the transistor, the organic light-emitting diode including a first electrode, an organic light-emitting layer disposed on the first electrode and a second electrode disposed on the organic light-emitting layer, the transistor including an active pattern, a drain electrode disposed on the active pattern and a connection electrode disposed on the drain electrode and electrically connecting the drain electrode to the first electrode of the organic light-emitting diode;
an encapsulation substrate disposed to face the array substrate; and
a sealing member disposed in a sealing area, the sealing member disposed between the array substrate and the encapsulation substrate to combine the array substrate with the encapsulation substrate, wherein the array substrate comprises:
an organic insulation layer disposed in a first peripheral area between the display area and the sealing area;
a power bus line disposed in the first peripheral area, the power bus line comprising a first wiring layer and a second wiring layer disposed on the first wiring layer, each of the first wiring layer and the second wiring layer overlapping the organic insulation layer; and
a compensation pattern disposed under the sealing member and extending along an outer edge of the sealing member, the compensation pattern comprising a first contiguous compensation layer and a second contiguous compensation layer, wherein:
the first compensation layer is connected to the first wiring layer, and
the second compensation layer is disposed on the first compensation layer in a same layer as the connection electrode and connected to the second wiring layer,
wherein the compensation pattern overlaps at least 50% of the sealing member, and
the compensation pattern has a first outer edge and the sealing member has a second outer edge spaced the first outer edge by about 100 μm to about 200 μm in a plan view.

2. The display device of claim 1, wherein each of the first compensation layer and the second compensation layer has a multi-layered structure comprising an aluminum layer.

3. The display device of claim 1, wherein a thickness of the compensation pattern is equal to or more than about 10,000 Å.

4. The display device of claim 1, wherein the compensation pattern further comprises a third compensation layer disposed under the first compensation layer.

5. The display device of claim 4, wherein the array substrate further comprises an inorganic insulation layer disposed between the first compensation layer and the third compensation layer.

6. The display device of claim 5, wherein the first compensation layer is electrically connected to the third compensation layer by passing through the inorganic insulation layer.

7. The display device of claim 4, wherein the third compensation layer comprises molybdenum.

8. The display device of claim 4, wherein the third compensation layer extends along the outer edge of the sealing member.

9. The display device of claim 4, wherein the compensation pattern further comprises a fourth compensation layer disposed under the third compensation layer.

10. The display device of claim 9, wherein the fourth compensation layer comprises a same material as the third compensation layer.

11. The display device of claim 1, wherein the array substrate further comprises an inorganic intermediate layer disposed between the first compensation layer and the second compensation layer and comprising an inorganic material.

12. The display device of claim 1, wherein the power bus line is configured to supply a power voltage to the organic light-emitting diode.

13. A display device comprising:
an array substrate comprising a pixel array disposed in a display area;
an encapsulation substrate disposed to face the array substrate; and
a sealing member disposed in a sealing area, the sealing member disposed between the array substrate and the encapsulation substrate to combine the array substrate with the encapsulation substrate,
wherein the array substrate comprises:
a power bus line disposed in a first peripheral area between the display area and the sealing area;
an upper compensation layer disposed under the sealing member and extending along an outer edge of the sealing member in a plan view, wherein the upper compensation layer and at least a portion of the power bus line are disposed on a same layer;
a lower compensation layer disposed under the upper compensation layer and extending along the sealing member in the plan view and comprising a different material from the upper compensation layer; and
an inorganic insulation layer disposed between the upper compensation layer and the lower compensation layer,
wherein an outer edge of the lower compensation layer extends beyond the sealing area to substantially entirely overlap the sealing area, and an outer edge of the upper compensation layer does not extend beyond the sealing area.

14. The display device of claim 13, wherein the upper compensation layer comprises aluminum.

15. The display device of claim 13, wherein the lower compensation layer comprises molybdenum.

16. The display device of claim 13, wherein the upper compensation layer comprises a first upper compensation layer and a second upper compensation layer.

17. The display device of claim 16, wherein the power bus line comprises a first wiring layer connected to the first upper compensation layer and a second wiring layer connected to the second upper compensation layer.

18. The display device of claim 16 the lower compensation layer comprises a first lower compensation layer and a second lower compensation layer disposed under the first lower compensation layer.

* * * * *